United States Patent
Mead et al.

(10) Patent No.: US 6,513,701 B2
(45) Date of Patent: Feb. 4, 2003

(54) METHOD OF MAKING ELECTRICALLY CONDUCTIVE CONTACTS ON SUBSTRATES

(75) Inventors: Donald I. Mead, Montrose, PA (US); Mark V. Pierson, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 29 days.

(21) Appl. No.: 09/879,222

(22) Filed: Jun. 12, 2001

(65) Prior Publication Data

US 2002/0000462 A1 Jan. 3, 2002

Related U.S. Application Data

(60) Continuation-in-part of application No. 09/605,617, filed on Jun. 28, 2000, now abandoned, which is a division of application No. 09/339,924, filed on Jun. 24, 1997, now Pat. No. 6,173,887.

(51) Int. Cl.[7] .......................... B23K 26/22; B23K 1/005
(52) U.S. Cl. ............... 228/248.1; 228/178; 228/180.22; 219/121.63
(58) Field of Search ............................. 228/248.1, 245, 228/125, 178, 180.1, 214, 222; 219/41, 121.63, 121.64, 121.65, 121.66, 121.85, 127

(56) References Cited

U.S. PATENT DOCUMENTS

| 3,710,069 A | 1/1973 | Papadopoulos et al. |
|---|---|---|
| 3,836,745 A | 9/1974 | Costello |
| 4,229,232 A | 10/1980 | Kirkpatrick |
| 4,535,219 A | 8/1985 | Sliwa et al. |
| 4,657,169 A | 4/1987 | Dostoomian et al. |
| 4,682,001 A | 7/1987 | Locke |
| 4,786,358 A | 11/1988 | Yamazaki et al. |
| 4,832,982 A | 5/1989 | Mori et al. |
| 4,865,245 A | 9/1989 | Schulte et al. |
| 5,156,697 A | 10/1992 | Bourell et al. |
| 5,159,171 A | 10/1992 | Cook et al. |
| 5,272,307 A | 12/1993 | Jones |
| 5,292,418 A | 3/1994 | Morita et al. |
| 5,433,368 A | 7/1995 | Spigarelli |
| 5,466,908 A | 11/1995 | Hosoya et al. |
| 5,492,572 A | 2/1996 | Schroeder et al. |
| 5,497,546 A | 3/1996 | Kubo et al. |
| 5,509,597 A | 4/1996 | Laferriere |
| 5,539,153 A | 7/1996 | Schwiebert et al. |
| 5,545,465 A | 8/1996 | Gaynes et al. |
| 5,586,715 A | 12/1996 | Schwiebert et al. |
| 5,641,113 A | 6/1997 | Somaki et al. |
| 5,658,827 A | 8/1997 | Aulicino et al. |
| 5,770,835 A | 6/1998 | Sakuyama et al. |

(List continued on next page.)

FOREIGN PATENT DOCUMENTS

| JP | 402247076 | 10/1990 |
|---|---|---|
| JP | 4106459 | 4/1992 |

OTHER PUBLICATIONS

IBM TDB. vol. 38, No. 05, May 1995, "Using Selective Additive in Material to Absorb Energy From a Tuned Laser".

Primary Examiner—Tom Dunn
Assistant Examiner—Colleen P. Cooke
(74) Attorney, Agent, or Firm—RatnerPrestia; Larry R. Fraley, Esq.

(57) ABSTRACT

A method of making an electrically conductive contact on a substrate by applying a layer of solder paste to a circuitized feature on a substrate and selectively heating and melting the solder paste over the feature to form a solder bump. The excess solder paste is removed. A focused energy heat source such as a laser beam or focused Infrared heats the solder paste. A reflective mask with apertures may be used to allow focused heating source to selectively melt areas of the solder paste layer applied to a circuitized feature. The mask and excess solder paste are removed.

20 Claims, 5 Drawing Sheets

U.S. PATENT DOCUMENTS

| | | |
|---|---|---|
| 5,829,125 A | 11/1998 | Fujimoto et al. |
| 5,872,051 A | 2/1999 | Fallon et al. |
| 5,994,783 A | 11/1999 | You |
| 6,072,150 A | 6/2000 | Sheffer |
| 6,369,345 B1 * | 4/2002 | Zaloga et al. ............ 219/85.13 |
| 6,403,399 B1 * | 6/2002 | Pekin et al. ........... 219/121.63 |

* cited by examiner

METHOD OF MAKING ELECTRICALLY CONDUCTIVE CONTACTS ON SUBSTRATES

CROSS-REFERENCE TO RELATED APPLICATIONS

This application is a continuation-in-part of U.S. patent application Ser. No. 09/605,617, filed on Jun. 28, 2000 now abandoned, which is a divisional of U.S. patent application Ser. No. 09/339,924; filed on Jun. 24, 1999, now U.S. Pat. No. 6,173,887.

TECHNICAL FIELD

This invention relates to the formation of an electrically conductive contact on a substrate (e.g. printed circuit board, semiconductor chip and chip carrier).

BACKGROUND OF THE INVENTION

Processes for integration of semiconductor chips and other components onto circuitized carriers rely on a bonding method to join the electrodes of the chip or component to a substrate. This can be achieved by metallurgical bonding such as soldering, or by use of a conductive adhesive. Various methods can be used to form the contacts on chips, electrical components, and on substrates. In one example a solder ball preform of a high melt solder is fabricated first and then bonded to a component or substrate with a lower melt alloy. High melt solder bumps have also been formed by evaporation techniques such as on semiconductor chips. Component bump formation and solder ball bonding are usually processed en masse, in an evaporator or oven to cause melting. Formation of high temperature bumps on organic substrates can become quite problematic because of the potential damage that can be caused by subjecting the substrate or component to the elevated temperature required to form the bump. The equipment and processing associated with these technologies are relatively expensive and difficult to control for reliable bump or joint formation. More specific examples of various methods for forming solder-type contacts are discussed in the following U.S. Patents and publication.

U.S. Pat. No. 5,586,715 by Schwiebert et al., a method is described to produce solder balls by contained paste deposition using an attached mask on non-wettable substrate, and heating the substrate-mask assembly at a temperature to reflow the solder paste into a solder ball. The invention is limited in that it relies on having to use dewettable components to form a ball and heating the entire substrate, mask, and solder material en mass.

In U.S. Pat. No. 5,539,153 by Schwiebert et at., a method is described for bumping substrates by contained paste deposition using an attached mask on substrate. The invention is limited in that the entire substrate, mask, and solder paste are all heated to the solder reflow temperature to form the resultant solder bump and is dependent on having a non-wettable mask to contain the solder paste.

In U.S. Pat. No. 5,658,827 by Aulicino et al., a method is described for forming solder ball contacts on substrates by squeegeeing solder paste through apertures in reusable mask. The method describes heating the reusable mask containing the solder and the substrate to reflow temperature in order to form the resultant balls.

U.S. Pat. No. 4,229,232 by Kirkpatrick, describes a method for thermal processing on or near the surface of a metallic or dielectric material using a pulsed beam. The method is limited in that it thermally treats only the selected area's surface or near surface, rather than heating and melting the entire solder paste layer thickness and additionally heating the circuitized feature to form a solder bump bonded to the circuited feature.

U.S. Pat. No. 4,832,982 by Mori et al., describes a process for forming a dispersion alloy layer on a metallic base starting with a powder alloy which separates into two separate liquid phases when irradiated by a laser and is then quenched to form a solid on a substrate surface. The process requires the formation of two liquid phases over a substrate surface rather than forming a solder bump on a circuitized feature.

U.S. Pat. No. 5,509,597 by Laferriere, describes a process and apparatus wherein solder paste is applied over a first material, a second material is placed over the solder paste and the structure is heated by a laser beam to produce a solder joint between two materials. The apparatus and method are limited in that these are concerned with soldering two materials together rather than forming solder bumps on circuitized features for subsequent soldering.

U.S. Pat. No. 5,272,307 by Jones, similarly describes a method and apparatus to solder leads together with heat from a laser. A work plate is used to hold the two leads together while the solder is melted between the two leads. This patent does not describe forming solder bumps on circuitized features.

U.S. Pat. No. 5,156,697 by Bourell et al, describes a method and apparatus to direct a laser onto a powder comprised of a low temperature material and a high temperature material to produce a bulk sintered mass. Here the lower temperature material melts while the higher temperature remains unmelted while forming the sintered mass. This patent relies on two materials of differing melting temperatures and attempts to form bulk material compounds and not solder bumps on a circuitized feature.

U.S. Pat. No. 5,641,113 by Somaki et al., describes a process where a solder ball is reflowed over an electrode on a substrate to form a solder bump. Then, another ball of similar metallurgy is placed on top of the solder bump and reflowed to form an interconnection joint. The process requires a stencil to contain the first reflowed solder ball and relies on the same ball metallurgy for joining the second ball to the first ball.

U.S. Pat. No. 4,865,245 by Schulte et al., describes a method for joining two semiconductor devices by applying pressure to two devices to cause a cold weld junction between respective solder bumps of each semiconductor. The method relies strictly on the ability to cold weld between two electrode bumps and requires applying potentially damaging pressure to the semiconductor devices which could cause crack initiation.

U.S. Pat. No. 3,836,745 by Costello, describes a method of solder coating and joining members by heating a predetermined portion of members through the use of radiant energy adsorbent material deposited on the members. The method is limited in that it requires the heating of the entire ribbon layer of solder paste between members and over members, relying on wicking away of the molten solder between the members to prevent solder bridging.

IBM Technical Disclosure Bulletin, Vol. 38, No. 05, May 1995, describes an additive that is added to solder paste to improve the adsorption characteristic of the solder paste to reduce the energy required of a laser to cause solder reflow.

This publication does not describe formation of solder bumps on circuitized features using laser or focused infrared energy source.

It is believed that the method of selective heating of a layer of solder paste over a circuitized feature having the advantageous features cited herein and otherwise discernible from the aforementioned teachings would represent a significant advancement in the art.

DISCLOSURE OF THE INVENTION

It is a primary object of this invention to enhance the art of providing electrical contacts on circuitized substrates.

It is a further object to provide a method of making such contacts wherein solder forms an important part thereof.

It is yet another object of the invention to provide a method for selectively heating an area of solder paste over a circuitized feature to form a solder bump which can be used for a subsequent interconnection to contacts of another component or components.

According to one aspect of the invention, there is provided a method of making at least one electrically conductive contact on a substrate comprising the steps of: providing a substrate with a surface having at least one circuitized feature; applying a layer of solder paste over the surface of the substrate and at least a portion of the circuitized feature; providing a mask having a top surface and a bottom surface and at least one opening; orienting the mask such that at least one opening in the mask is aligned with the circuitized feature; positioning the bottom surface of the mask on the layer of the solder paste; directing a focussed radiation beam having a beam diameter larger than said mask opening on said solder paste through said opening in said mask and selectively heating substantially only the solder paste over the circuitized feature through the mask sufficiently to melt the solder paste over the circuitized feature to form a substantially solid conductive solder bump while not significantly heating the remainder of the solder paste over the surface of the substrate or substantially altering the configuration; removing the mask and removing the solder paste that was not significantly heated.

Another aspect of the invention is a method of making at least one electrically conductive contact on a substrate comprising the steps of: providing a substrate with a surface having at least one circuitized feature; applying a layer of solder paste over the surface of the substrate and at least a portion of the circuitized feature; providing a mask having a top surface and a bottom surface and at least one opening; orienting the mask such that at least one opening in the mask is aligned with the circuitized feature; positioning the mask immediately above the layer of solder paste at a spaced distance; directing a focussed radiation beam having a beam diameter larger than said mask opening on said solder paste through said opening in said mask and selectively heating substantially only the solder paste over the circuitized feature through the mask sufficiently to melt the solder paste over the circuitized feature to form a substantially solid conductive solder bump while not significantly heating the remainder of the solder paste or substantially altering the configuration, the heating and forming of the conductive solder bump occurring without the mask contacting the solder paste or substrate; removing the mask; and thereafter removing the solder paste that was not significantly heated.

BRIEF DESCRIPTION OF THE DRAWINGS

Preferred embodiments of the invention are described with reference to the accompanying diagrammatic section drawings, in which.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
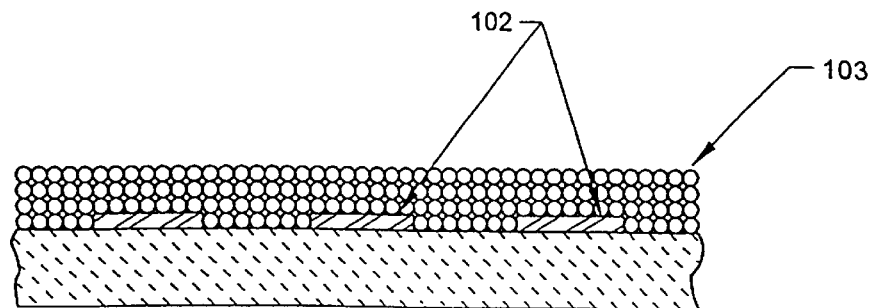
FIGS. 1–3 illustrate one embodiment of the invention showing steps to form solder bumps on circuitized features from a layer of solder paste applied over a circuitized substrate, and providing selective heating thereof.
Figure 11:
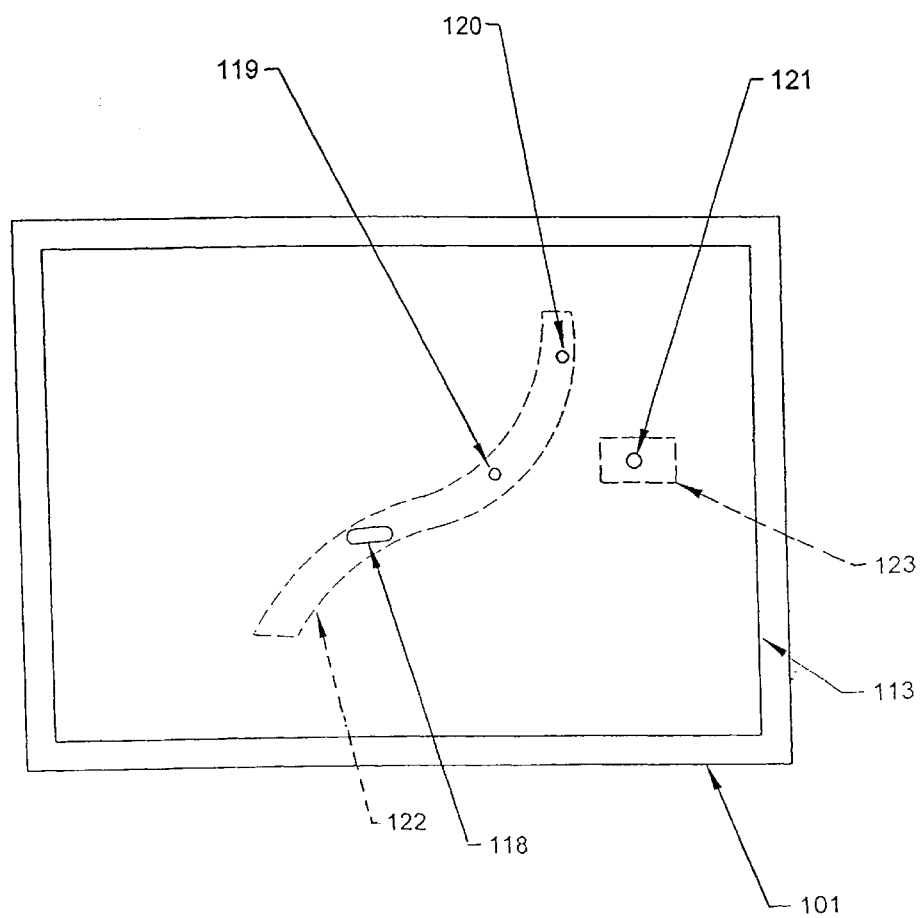
FIG. 11 illustrates an embodiment showing the formation of solder bumps on two representative circuitized features on a substrate from a layer of solder paste which substantially covers the circuitized features, and providing selective heating thereof.

Referring to FIG. 1, a substrate or electrical component 101 (e.g., a printed circuit board) includes circuitized features 102 formed by electrolytic or electroless plating techniques or by sputtering. Typically, these circuitized features are plated copper or other electrically conductive metal and are typically 0.001" thick. A solder paste layer 103, with a thickness of about 0.002" to 0.010", is applied over the surface of the substrate and over the circuitized features. A water soluble solder paste which melts at 183 deg. C., such as 63 wt. % lead and 37 wt. % tin, may be used to form eutectic solder bumps. A water soluble solder paste which melts at 302 deg. C., such as 90 wt. % lead and 10 wt. % tin, may also be used to form high temperature solder bumps. One example is Indalloy #159, manufactured by Indium Corp., Utica, N.Y. The layer of solder covers the complete surface of the substrate and circuitized features in FIG. 1. A layer thickness of 0.003" is preferably used, but this will depend on how much of the feature needs to be covered with a solder bump and the size or height of the bump desired. The paste layer need not cover the complete surface of the substrate but can cover a partial area of the substrate surface and its associated circuitized feature, or just a partial area of a circuitized feature. Examples are shown in FIG. 11. The solder paste 103 can be dried on the substrate in an oven at 110 degrees F. for 60 minutes or air dried, to remove the paste solvents and any solvents used to facilitate handling.

Figure 2:
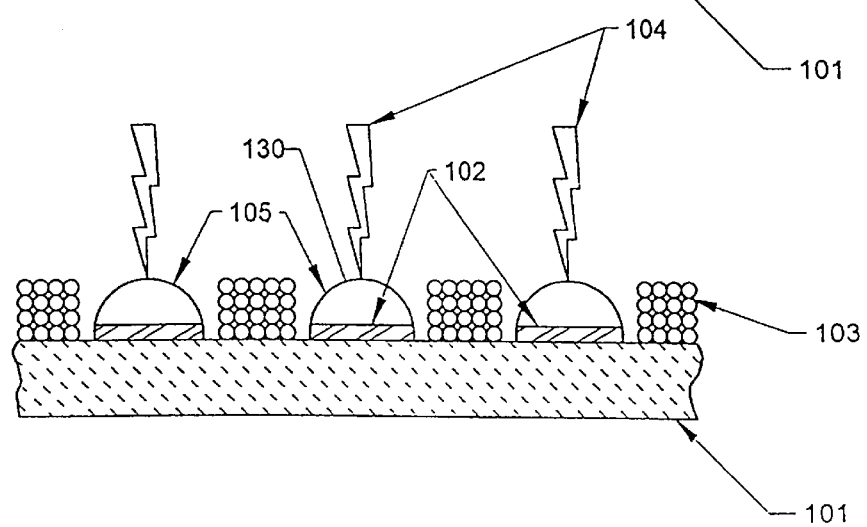

Referring to FIG. 2, a beam from a laser or infrared energy source 104 melts the solder paste over the circuitized feature 102 to form a solder bump or ball 105. The solder paste 103 which was not treated by the energy source 104 remains as unmelted solder paste. A Nd:YAG laser, 1064 nanometers wavelength, continuous wave laser, model 570M, manufactured by Lee Laser, Inc., Orlando, Fla., may be used for selective solder melting of low temperature solder pastes. A pulse duration of 200 microseconds to one second, at 3 watts output, will successfully form a solder bump on a 0.003" thick layer of solder paste over a 0.001" thick copper contact pad. The resulting bump will have a width substantially the same as the pad width, and a height of from about 0.001" to about 0.050". Note that this bump configuration is semi-spherical, with a rounded upper curved surface 130.

For higher temperature applications, such as with high melt solder pastes, a 250 Hz CO2 Laser, model Diamond 64, manufactured by Coherent, Inc., Laser Products Division, Santa Clara, Calif., can be used. Bumps have been formed using 20 to 50 pulses per solder bump, each pulse being approximately 100 microseconds at 3 watts, on a 0.003" thick solder paste layer over a 0.001" copper contact pad.

Infrared energy can be generated from a linear source such as Research Inc., Model 5215 (available from Research Energy Systems Div., Minneapolis, Minn.), with an energy output of 400 watts/linear inch, and a line width of 00.18", using a parabolic reflective mirror. A spot infrared source, such as Research Inc., Model 4085, with an energy of 650 watts/in$^2$ can also be used. Treatment times of ½ to 120 seconds can be used.

While specific laser and infrared parameters have been recited here, it is recognized by those skilled in the art that other parameter settings may be desirable, depending on work piece, solder paste thickness, solder paste composition, and pad thickness for example.

Figure 3:
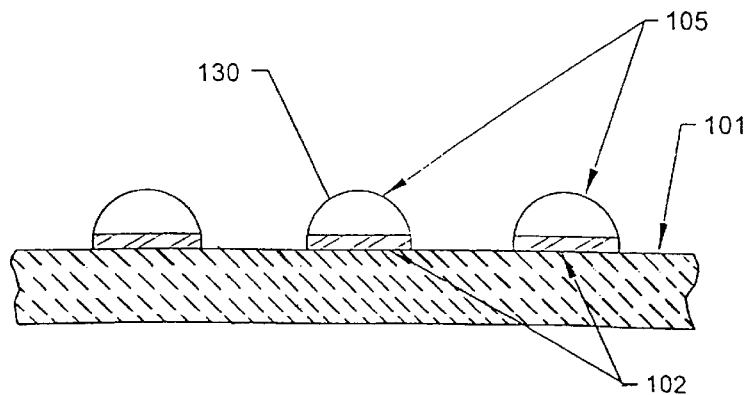

Referring to FIG. 3, after the solder bumps 105 have been allowed to cool and solidify, the unmelted residual solder paste is removed, preferably with a distilled water wash. This leaves the substrate 101 free of solder paste between the circuitized features 102, each now with a solder bump 105 thereon.

FIGS. 4 through 7 illustrate another embodiment of the invention wherein a reflective mask with apertures is used to selectively allow an energy source (such as a scanning laser or focused infrared) to melt the exposed solder paste while protecting those areas where melting is not desired. The mask can be made from a material with low coefficient of thermal expansion, such as molybdenum with a gold flash plating (to improve reflectivity). Lowering the temperature of the mask and substrate surface to a minimum is strongly desired, particularly while the selective melting is occurring. The molybdenum and reflective coating assure this feature. The mask may be placed on the solder paste in contact therewith or may positioned so that it is over the solder paste but not in contact with it.

Figure 4:
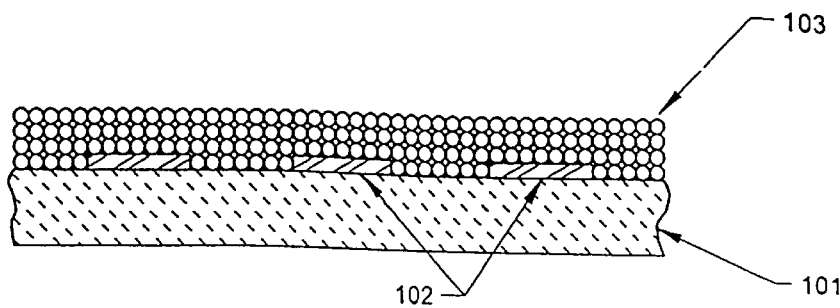
FIGS. 4–7 illustrate another embodiment of the invention showing steps to form solder bumps on circuitized features from a layer of solder paste applied over a circuitized substrate and providing selective heating thereof through apertures in a mask.

FIG. 4 shows a substrate 101, with circuitized features 102, and covered with a layer of solder paste 103.

Figure 5:
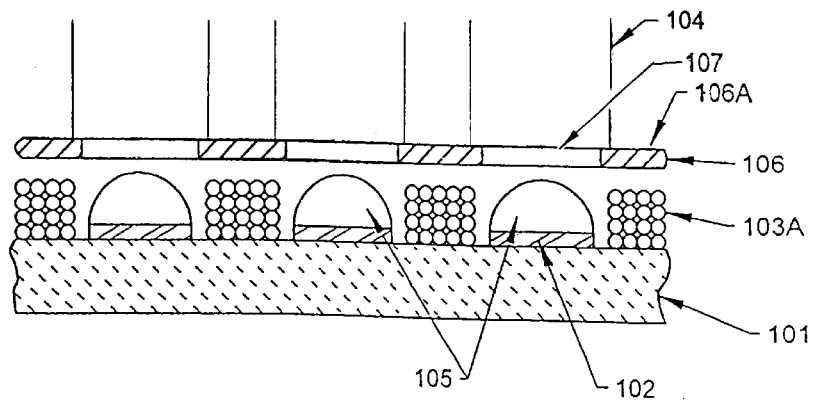

FIG. 5 shows a mask 106 with apertures 107. The mask is oriented with respect to the so that at least one opening is aligned with at least one circuitized feature, and preferably so that a number of openings are so aligned. The top surface 106A of the mask is, preferably, polished or coated with a reflective material such as a gold film. An energy source, preferably a laser, even though such source may also be any of the examples described earlier, generates a radiation beam 104 which is preferably a focussed radiation beam. The radiation beam has a diameter 101 at the point of impact on the mask 106. This diameter is larger than the aperture 107 so that only a portion of the incident beam 104 passes through to the Solder paste 103, and melts the solder paste 103 over the selected areas of the circuitized features 102. Solder paste 103A which is shielded by the mask material does not reach melting temperature and remains as paste.

Figure 6:
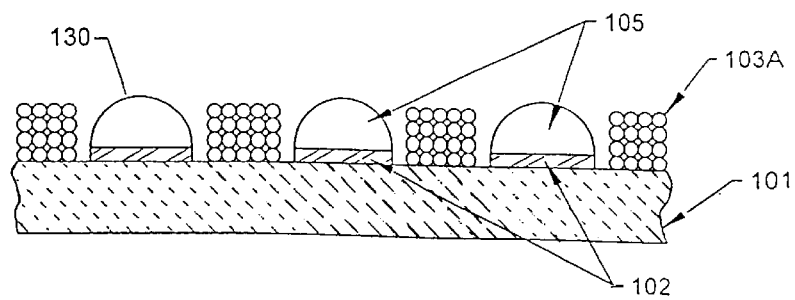

FIG. 6 shows the substrate 101 after the mask is removed. A solid solder bump 105 is formed, upon cooling, on the circuitized feature 102. The energy source heats the paste down to the surface of the circuitized feature 102, sufficient to cause the solder paste to melt and metallurgically bond to the circuitized feature. Unmelted solder paste 103A remains as paste. Bumps 105 included the rounded upper surface 130.

Figure 7:
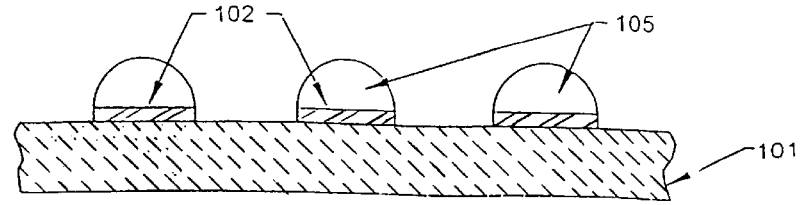

FIG. 7 shows the finished substrate 101 wherein the unmelted solder paste 103A has been removed, such as with a water wash, leaving the circuitized features 102 with solder bumps 105. These bumps are similar in size to the bumps formed in FIGS. 1–3.

Figure 8:
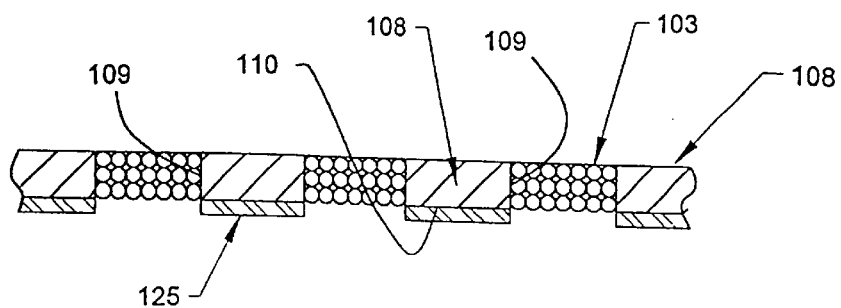
FIGS. 8–10 illustrate yet another embodiment of the invention showing steps to form solder bumps on circuitized features using, again, a mask which has apertures filled with solder paste, providing selective heating thereof, and removing the mask.
Figure 9:
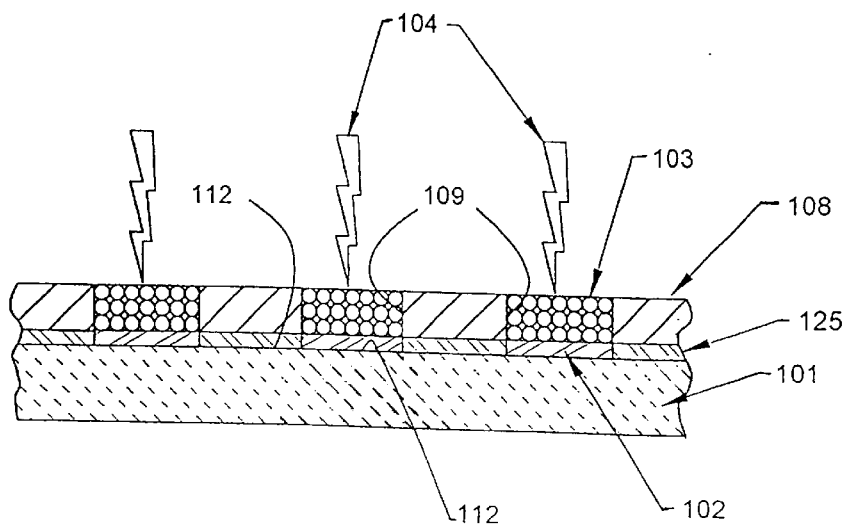
Figure 10:
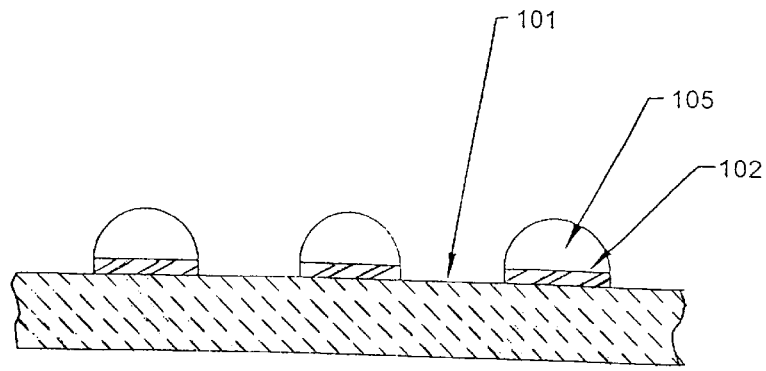

FIGS. 8–10, show an embodiment of the invention wherein a substrate 101 with circuitized features 102 has a mask 108 or film with apertures 109 pre-filled with solder paste 103, placed on the upper surface 112 of the substrate, the pre-filled apertures each aligning with respective ones of the circuitized features. Selective heating by laser or infrared melts the solder paste, forming a solder bump on the circuitized feature.

More particularly, FIG. 8 shows a cross-sectional view of such a film or mask 108 with a bottom surface 110. An optional layer of adhesive 125 may be applied to bottom surface 110. Apertures 109 are filled with solder paste 103, using a squeegee or a dispensing nozzle. Drying the solder paste while in the film tape facilitates handling of the film tape. The film 108 can be fabricated from polyimide made by E. I DuPont de Nemours & Co., Inc., Wilmington, Del., such as KAPTON (TM) or KAPTON tape with adhesive. Apertures 111 may be formed by mechanical means, laser drilling, or by chemical etching with a solution, e.g., potassium hydroxide and/or potassium carbonate. An optional layer of mild silicone adhesive 125 made by Furon, New Haven, Conn., product number K250 or K2554, can be applied to the bottom surface of the film, to form a tape, which improves contact with the substrate top surface 112.

FIG. 9 shows mask 108 placed on the top surface 112 of substrate 101. The apertures 109, which are pre-filled with solder paste, are aligned with the circuitized features 102. Focused energy source 104 melts the solder paste within the apertures 111 of the mask 108 while the mask is positioned as shown in FIG. 9. Thus, the mask shields substrate 101 from some heat generated during this process. FIG. 10 shows the substrate with the mask and adhesive layer removed after the solder bmumps 105 have been formed on the circuitized features.

FIG. 10 shows the substrate 101 with the mask 108 and adhesive layer 125 removed after the solder bumps 105 have been formed on the circuitized features 102. Examples of some energy sources with their recommended parameter settings were discussed earlier.

Continuing with FIG. 11, a substrate 101 has circuitized features 122 and 123 which can be coated with solder paste shown by the area contained within the peripheral line 113. A focused energy source selectively melts the solder paste as shown by 118, 119, 120 and 121.

Figure 12:
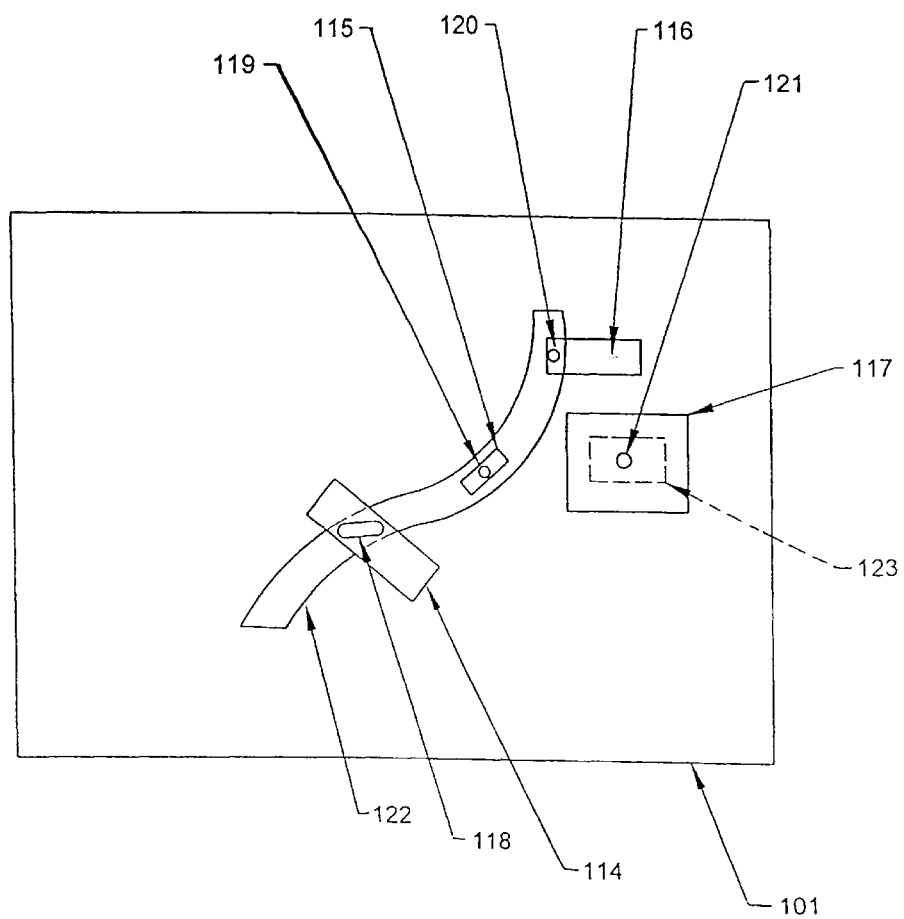
FIG. 12 illustrates an embodiment showing the formation of solder bumps on two representative circuitized features on a substrate, from a layer of solder paste which in one example substantially covers a circuitized feature and in another, partially covers a circuitized feature, and providing selective heating thereof.

Alternatively, as shown in FIG. 12, previously described circuitized features 122 and 123 on substrate 101, can be covered with a layer of paste, represented by 114, 115, 116 and 117. These smaller areas of solder paste can be applied over the complete circuit feature 123, or partially over a circuit feature 122. As previously described above, a focused energy source selectively melts the solder paste as shown by 118, 119, 120 and 121.

The invention uses focused energy sources to rapidly melt solder paste in selected areas over desired circuitized features, without damaging ordinarily heat sensitive materials (e.g., those of the underlying substrate). High temperature solder bumps may be formed on heat intolerant substrates without causing damage. While the ability to form high temperature solder bumps is a distinct advantage, those with ordinary skill in the art will recognize that the invention can use lower melt temperature pastes and alloys to form the solder coatings or formations.

Interconnect structures can be formed between first and second substrates each having high temperature bumps made by the focused energy melting of solder paste described herein. In this example, a lower temperature metal or alloy can be applied to the bumps on the first substrate. The bumps on the second substrate can then be flattened and fluxed, the two substrates brought together to contact the respective bump arrays thereof, and heat applied sufficient to melt the low temperature metal, thus forming several metallurgical bonds.

While there have been shown and described what are at present considered the preferred embodiments of the invention, it will be obvious to those skilled in the art that various modifications made be made therein without departing from the scope of the invention as defined by the appended claims.

What is claimed:

1. A method of making at least one electrically conductive contact on a substrate, said method comprising the steps of:
   providing a substrate with a surface having at least one circuitized feature thereon;
   applying a layer of solder paste over said surface of said substrate and at least a portion of said at least one circuitized feature;
   providing a mask, having a top surface and a bottom surface, and at least one opening therein;
   orienting said mask such that said at least one opening in said mask is aligned with said at least one circuitized feature;
   positioning said bottom surface of said mask on said layer of said solder paste;
   directing a radiation beam having a beam diameter larger than said mask opening on said solder paste through said opening in said mask, and selectively heating substantially only said solder paste over said at least one circuitized feature through said mask under said opening sufficiently to melt said solder paste over said at least one circuitized feature to form a substantially solid conductive solder bump commensurate with said mask opening on said at least one circuitized feature while not significantly heating the remainder of said solder paste over said surface of said substrate or substantially altering the configuration thereof;
   removing said mask; and
   removing said solder paste that was not significantly heated.

2. The method of claim 1 further including the step of substantially drying said layer of solder paste before said selectively heating.

3. The method of claim 1 wherein said selectively heating of said solder paste is achieved using a laser light source.

4. The method of claim 3 further including the step of polishing said top surface of said mask.

5. The method of claim 3 further including the step of providing said top surface of said mask with a layer of reflective material.

6. The method of claim 1 wherein said selectively heating of said solder paste is achieved by using infrared energy.

7. The method of claim 6 further including the step of polishing said top surface of said mask.

8. The method of claim 6 further including the step of providing said top surface of said mask with a layer of reflective material.

9. The method according to claim 1 wherein said energy beam is a focussed energy beam.

10. The method according to claim 9 wherein said focussed energy beam is a laser beam.

11. A method of making at least one electrically conductive contact on a substrate, said method comprising the steps of:
    providing a substrate with a surface having at least one circuitized feature thereon;
    applying a layer of solder paste over said surface of said substrate and at least a portion of said at least one circuitized feature;
    providing a mask, having a top surface and a bottom surface, and at least one opening therein;
    orienting said mask such that said at least one opening in said mask is aligned with said at least one circuitized feature;
    positioning said mask immediately above said layer of said solder paste at a spaced distance therefrom;
    directing a radiation beam having a beam diameter larger than said mask opening on said solder paste through said opening in said mask, and selectively heating substantially only said solder paste over said at least one circuitized feature through said mask under said opening sufficiently to melt said solder paste over said at least one circuitized feature to form a substantially solid conductive solder bump on said circuitized feature commensurate with said mask opening, while not significantly heating the remainder of said solder paste or substantially altering the configuration thereof, said heating and forming of said conductive solder bump occurring while said mask is positioned at said spaced distance from said solder paste;
    removing said mask; and
    removing said solder paste that was not significantly heated.

12. The method of claim 11 further including the step of substantially drying said layer of solder paste before said selectively heating.

13. The method of claim 11 wherein said heating of said solder paste is achieved using a laser light source.

14. The method of claim 11 further including the step of polishing said top surface of said mask.

15. The method of claim 14 further including the step of providing said top surface of said mask with a layer of reflective material.

16. The method of claim 11 wherein said heating of said solder paste is achieved by using infrared energy.

17. The method of claim 16 further including the step of polishing said top surface of said mask.

18. The method of claim 16 further including the step of providing said top surface of said mask with a layer of reflective material.

19. The method according to claim 11 wherein said energy beam is a focussed energy beam.

20. The method according to claim 19 wherein said focussed energy beam is a laser beam.

* * * * *